(12) United States Patent
Lim et al.

(10) Patent No.: US 7,956,657 B2
(45) Date of Patent: Jun. 7, 2011

(54) TIME DELAY APPARATUS

(75) Inventors: Teck Hwee Lim, Singapore (SG); Jee Khoi Yin, Singapore (SG); Yan Wah Michael Chia, Singapore (SG)

(73) Assignee: Agency for Science, Technology and Research, Singapore (SG)

( * ) Notice: Subject to any disclaimer, the term of this patent is extended or adjusted under 35 U.S.C. 154(b) by 46 days.

(21) Appl. No.: 11/911,728

(22) PCT Filed: Apr. 18, 2006

(86) PCT No.: PCT/SG2006/000099
§ 371 (c)(1),
(2), (4) Date: Jun. 20, 2008

(87) PCT Pub. No.: WO2006/112797
PCT Pub. Date: Oct. 26, 2006

(65) Prior Publication Data
US 2009/0128204 A1   May 21, 2009

Related U.S. Application Data

(60) Provisional application No. 60/672,975, filed on Apr. 18, 2005.

(51) Int. Cl.
*H03L 7/06* (2006.01)
(52) U.S. Cl. ........ 327/158; 327/156; 327/157; 327/161; 331/17; 375/371; 375/375; 375/376
(58) Field of Classification Search .................. 327/147, 327/156, 161, 242; 375/371; 331/17
See application file for complete search history.

(56) References Cited

U.S. PATENT DOCUMENTS

| 5,943,010 | A | 8/1999 | Rudish et al. |
| 6,484,268 | B2 | 11/2002 | Tamura et al. |
| 6,794,912 | B2 * | 9/2004 | Hirata et al. ................. 327/158 |
| 2002/0021775 | A1 | 2/2002 | Dietl et al. |
| 2004/0052322 | A1 * | 3/2004 | Robertson et al. ............ 375/371 |
| 2004/0212411 | A1 | 10/2004 | Saeki |

FOREIGN PATENT DOCUMENTS

EP   957532   11/1999

OTHER PUBLICATIONS

Maccarini P. F. et al. "Coupled Phase-Locked Loop Arrays for Beam Steering" IEEE MTT-S Digest 2003 No. Th4B-6, Abstract, figure 1.
International Serach Report—Chapter 1, PCT/SG2006/000099, mailed on May 24, 2006.
Haq Al-Ani A., et al., "A Phase-Locking Method for Beam Steering in Active Array Antennas," *IEEE Transactions on Microwave Theory and Techinques*, vol. MTT-22, Jun. 1974.
International Preliminary Report on Patentability—Chapter 1, PCT/SG2006/000099, mailed on Nov. 1, 2007.

* cited by examiner

*Primary Examiner* — Lincoln Donovan
*Assistant Examiner* — John W Poos
(74) *Attorney, Agent, or Firm* — Choate, Hall & Stewart LLP (57) ABSTRACT

A time delay apparatus for generating a plurality of phase shifted signals is described comprising a phase tuner generating a phase control signal and a phase interpolator receiving at least one digital signal and generating the plurality of phase shifted signals by phase shifting the digital signal according to the phase control signal.

12 Claims, 7 Drawing Sheets

TIME DELAY APPARATUS

CROSS-REFERENCE TO RELATED APPLICATIONS

The present application claims the benefit under 35 U.S.C. 371 of International Application No. PCT/SG2006/000099 (published PCT application No. WO 2006/112797 A1), filed Apr. 18, 2006, which claims priority to U.S. Provisional Application No. 60/672,975, filed Apr. 18, 2005. The entire contents of each of the above-referenced applications are incorporated herein by reference.

The invention relates to a time delay apparatus.

In wireless transmitter and receiver systems, beam forming or beam steering may be accomplished by switching antenna elements or by changing the relative phases of the radio frequency signals driving the antenna elements. Current beam forming or beam steering methods in the analog domain require phase shifters. An alternative is the conversion to the optical domain because of the higher resolution at optical frequencies. These methods are often bulky and not power efficient. Further, state of the art phase shifters are limited in bandwidth. Wide band phase shifters can be implemented using switches to fixed delay transmission lines such as microstrips and Monolithic Microwave Integrated Circuits (MMICs). However, this comes at the expense of size and cost.

A good beam steering performance can be achieved at the digital domain by using direct digital synthesizers (DDS) or even Digital Signal Processors (DSPs). However, this leads to a high power consumption and a high complexity and thus to high cost and is not suitable for mobile applications.

In [1], it is described to use an array of DDS coupled to an array of Digital to Analog Converters (DACs) for the generation of phase interpolated signals. Each DDS generates a digital sine wave signal representing the transmit signal. Each of the digital sine waves generated by the DDS is characterized by a frequency value and a phase value. Each of these values is independently controllable by digital control of the DDS that generates the sine wave. The phase relationship between each DDS is maintained by the use of a common clock signal. A DAC is used to generate an analog signal is responsive to the digital sine wave signal. This analog signal is operatively coupled to a corresponding radiator element. This method requires a number of N DDS and DACs for the generation of N phase interpolated signals. This results in a demand for a large chip area and high power consumption.

In [2], a method for interpolating clock signals to generate multi phase clocks for applications in microprocessors is described. Conventionally, phase lock loops (PLLs) and delay lock loops (DLLs) and clock distribution networks have been used to generate multi-phased clocks for microprocessor applications. In [2], also PLLs/DLLs with delay circuits are used to perform phase interpolation. Further, a clock generator is used for generating a clock that is synchronised with a reference clock. A control signal is generated that is responsive to the phase difference between the reference clock and the generated clock. A delay circuit is used for generating a multi-phase clock based on the clock and the control signal. The clock generator generates a signal having a frequency equal to an integral multiple of the frequency of the reference clock and outputs the signal as the clock. The delay circuit has a circuit receiving the clock and including a series of delay elements in form of a cascade each giving a delay according to the control signal. Signals output from the series of delay elements are used as signals constituting the multi-phase clock. This method requires a series of delay elements and phase interpolation to have an integer relationship with the reference clock.

A time delay apparatus for generating a plurality of phase shifted signals is provided comprising a phase tuner generating a phase control signal and a phase interpolator receiving at least one digital signal and generating the plurality of phase shifted signals by phase shifting the digital signal according to the phase control signal.

Further, a time delay apparatus for generating a plurality of phase shifted signals is provided comprising a comparator receiving at least one wave signal and generating at least one digital signal by shaping the at least one wave signal, a phase tuner generating a phase control signal, and a phase interpolator receiving the at least one digital signal and generating the plurality of phase shifted signals by phase shifting the digital signal according to the phase control signal.

Illustratively, the phase tuner controls a phase control signal based on which the phase interpolator phase shifts the digital signal such that a shifted signal is generated. By performing various phase shifts of the digital signal, for example by phase shifting the digital signal according to various multiples of a phase difference specified by the phase control signal, a plurality of phase shifted signals is generated.

In contrast to the system described in [2], the time delay apparatus has the flexibility of variable time delay without being tied to a reference clock. No integer relationship with a reference clock is necessary. Therefore, the time delay apparatus may be used for beam-steering applications.

In one embodiment, a programmable time delay apparatus for generating a plurality of phase interpolated signals is provided comprising an analog to digital converter for shaping a plurality of parallel signals, a parallel to serial converter for converting the plurality of parallel signals to a plurality of serial signals, at least one phase interpolator for phase shifting the plurality of serial signals in response to a phase control signal to generate a plurality of phase shifted signals, a phase tuner for generating the phase control signal, a buffer for buffering the plurality of phase shifted serial signals, a serial to parallel converter for converting the plurality of phase shifted serial signals to a plurality of phase shifted parallel signals, and an array of buffers for buffering the plurality of phase shifted parallel signals.

In one embodiment, a transmission method is provided wherein each output from the time delay apparatus described above is buffered by at least one high-speed buffer to obtain fast rise and/or fast fall times and is further pulse shaped using at least one pulse forming network.

The outputs generated in this way may be fed to an array of antenna for beamsteering. A switch may be used to select one of the outputs and to connect the selected output to one of the antennas in an antenna array for beamsteering.

In one embodiment, a transmission method is provided according to which one of the outputs of the time delay apparatus described above and an external ultrawideband pulse signal are selected and both are fed to a mixer or a multiplier to produce a correlated output for beamsteering at reception.

In another embodiment, a transmission method is provided according to which an ultrawideband signal is delayed at a certain pulse repetition interval using the time delay apparatus described above and is correlated with the input signal of the time delay apparatus for maximum energy.

Embodiments of the invention emerge from the dependent claims.

The phase tuner is for example a phase locked loop. The phase locked loop may comprise a voltage controlled oscillator and the voltage input to the voltage controlled oscillator for controlling the frequency of the oscillation output by the voltage controlled oscillator may be the phase control signal.

Alternatively, a DLL (delay locked loop) may be used as phase tuner.

In one embodiment, the voltage controlled oscillator generates a first clock signal and the phase locked loop further comprises a receiving means for receiving a second clock signal, a phase comparator for comparing the phase difference between the first clock signal and the second clock signal to produce a digital error signal, a charge pump for converting the digital error signal to an analog error signal, a low pass filter for filtering the analog error signal to produce the phase control signal, and a frequency divider for dividing the first clock signal.

The digital error signal is for example a digital error pulse signal. The analog error signal is for example an analog error current.

In one embodiment, the phase control signal specifies a phase difference and the phase difference is programmable by setting a factor by which the frequency divider divides the first clock signal.

The time delay apparatus may further comprise a buffer for buffering the plurality of phase shifted signals.

In one embodiment, the time delay apparatus further comprises a comparator receiving at least one wave signal and generating the at least one digital signal by shaping the at least one wave signal.

The comparator is for example an analog to digital converter. The phase control signal may specify a phase difference and each phase shifted signal of the plurality of phase shifted signals may be generated by the phase interpolator by phase shifting the digital signal according to multiple of the phase difference.

In one embodiment, the digital signal is random (arbitrary). It may for example be generated pseudo-randomly. Similar, the wave signal may be random (arbitrary) and may be generated pseudo-randomly.

Illustrative embodiments of the invention are explained below with reference to the drawings.

Figure 1:
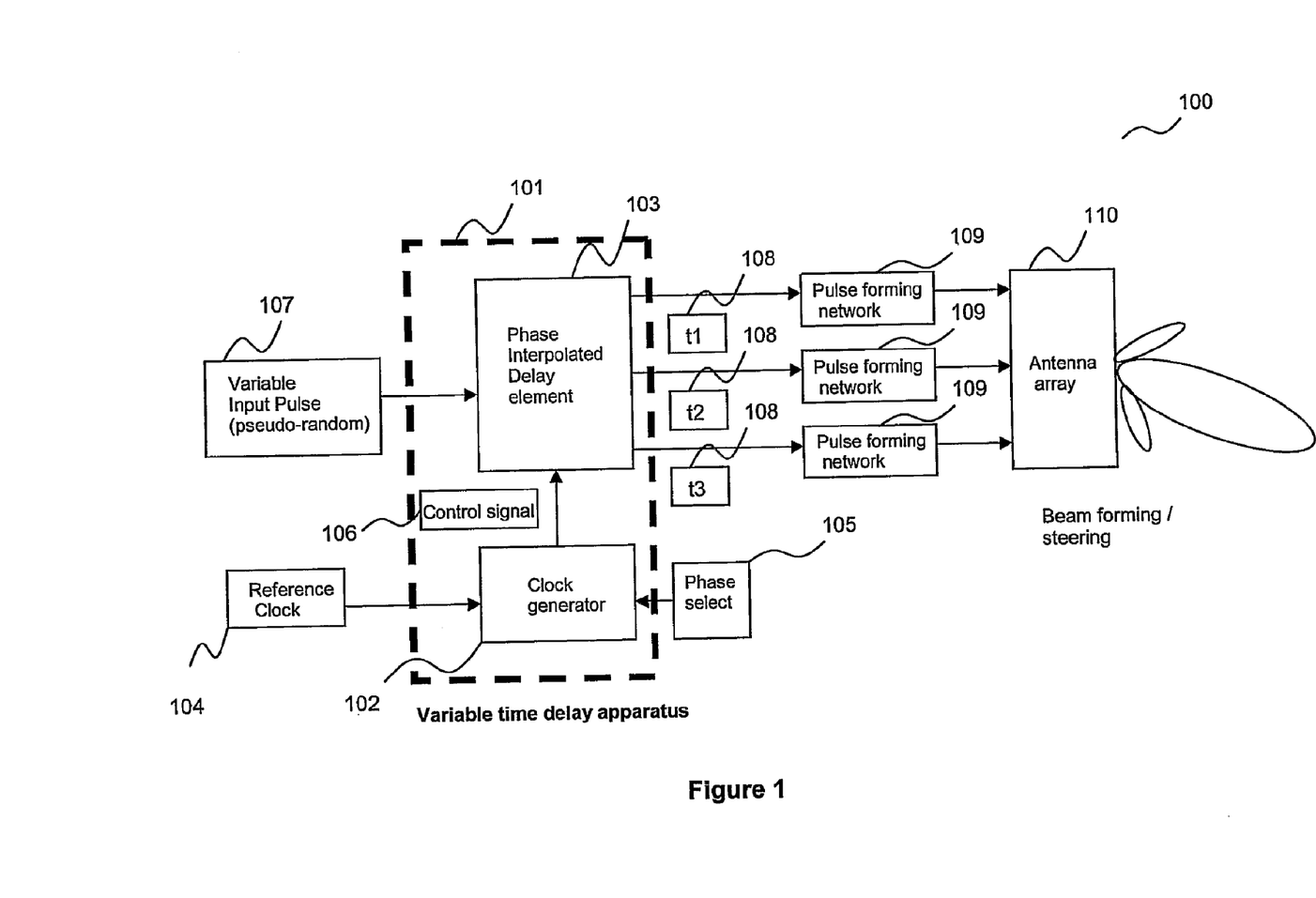
FIG. 1 shows a transmitter according to an embodiment of the invention.

FIG. 1 shows a transmitter 100 according to an embodiment of the invention.

The transmitter comprises a variable time delay apparatus 101 which comprises a clock generator 102 and a phase interpolated delay element 103. The clock generator 102 receives as input a reference clock signal 104 and a phase select signal 105 and generates a control signal 106 which is fed to the phase interpolated delay element 103.

In addition to the control signal 106, the phase interpolated delay element 103 receives an input pulse signal 107 as input which is variable (and may for example be a pseudo-random digital signal). The phase interpolated delay element 103 generates a plurality of phase shifted signals 108 which are each fed into a pulse forming network 109.

The pulse forming networks 109 generate radio pulses which are fed to an antenna array 110. Based on the generated radio pulses, beam forming and/or beam steering is performed.

Figure 2:
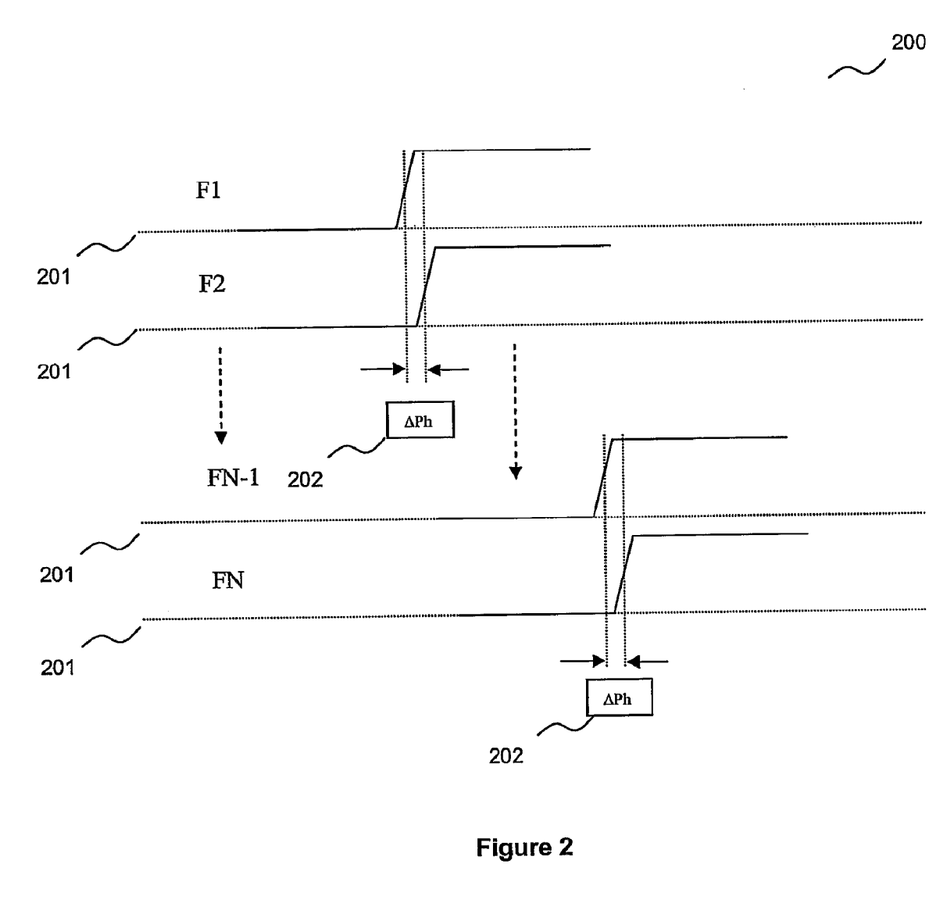
FIG. 2 shows a plurality of signals according to an embodiment of the invention.

The plurality of phase shifted signals 108 according to one embodiment of the invention is illustrated in FIG. 2.

FIG. 2 shows a plurality of signals 200 according to an embodiment of the invention.

The plurality of signals 200 consists of N signals 201 which are denoted by F1, F2, . . . , FN. Every two of the signals 201 are phase shifted by a phase shift 202 denoted by ΔPh. This means that F2 is phase shifted with respect to F1 by ΔPh, F3 is phase shifted with respect to F2 by ΔPh and so on. FN is phase shifted with respect to FN−1 by ΔPh. This means that FN is phase shifted by N−1 times ΔPh with respect to F1.

In one embodiment, the signals 201 are pseudo-random pulse signals (or pseudo-random digital signals).

As mentioned above, the signals 201 may be generated by a variable time delay apparatus 101 as shown in FIG. 1. In one embodiment, the variable time delay apparatus 101 is implemented as shown in FIG. 3.

Figure 3:
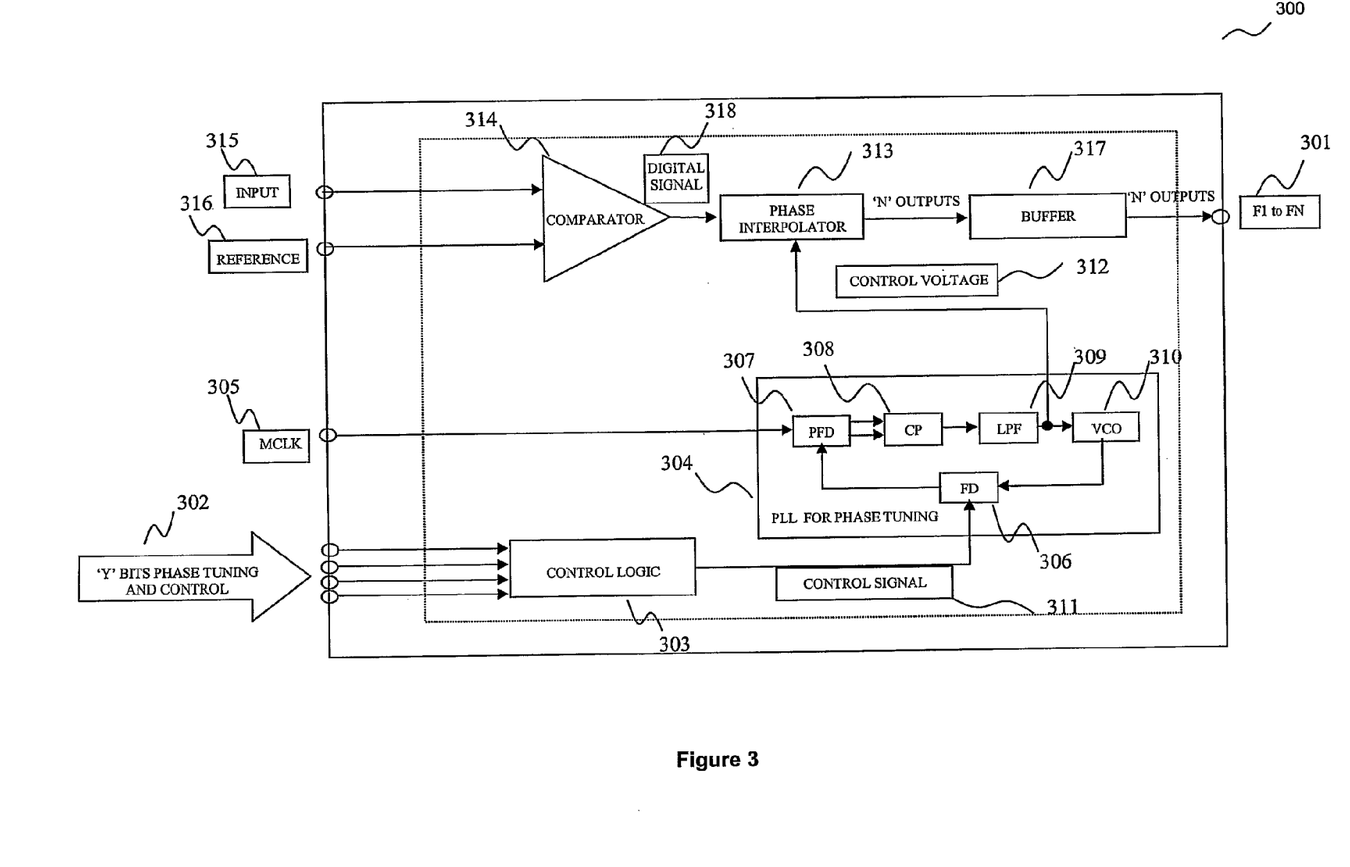
FIG. 3 shows a time delay apparatus according to an embodiment of the invention.

FIG. 3 shows a time delay apparatus 300 according to an embodiment of the invention.

The output of the time delay apparatus 300 is a plurality of signals 301 corresponding to the plurality of signals 200 denoted by F1 to FN.

The size of the phase shift ΔPh of the plurality of signals 301 as explained above with reference to FIG. 2 is defined by a plurality of input bits 302, denoted by Y. By setting the plurality of input bits 302 the time delay apparatus 300 may be programmed such that the phase shift ΔPh has a certain value, for example to a phase shift between 100 psec and 500 psec. The plurality of input bits 302 may for example be a binary representation of the resulting phase shift. In this way, the time delay apparatus 300 is digitally programmable for a desired phase shift. The plurality of the input bits 302 correspond to the phase select signal 105 shown in FIG. 1.

The plurality of input bits 302 is fed into a control logic 303 which interprets the plurality of input bits 302 and provides a corresponding control signal 311 to a phase locked loop (PLL) 304.

In addition to the control signal 311, the phase locked loop receives a reference clock signal 305 (denoted by MCLK) as input which corresponds to the reference clock signal 104 shown in FIG. 1.

The phase locked loop 304 comprises a frequency divider 306, a phase frequency detector 307, a charge pump 308, a low-pass filter 309 and a voltage controlled oscillator 310. The phase locked loop 304 corresponds to the clock generator 102 shown in FIG. 1.

The frequency divider 306 divides the frequency of a signal output from the voltage controlled oscillator 310 by a number of times specified by the control signal 311. The phase frequency detector 307 compares the phases between the output of the frequency divider 306 and the reference clock signal 305 and outputs a signal responsive to the phase difference to the charge pump 308. The charge pump 308 converts the (digital) output signal of the phase frequency detector 307 to a (analog) voltage responsive to the phase difference which is fed into the low-pass filter 309. The low-pass filter 309 outputs the low-frequency component of the input voltage to the voltage controlled oscillator 310. The output of the low-pass filter 309 is also input as control voltage 312 to a phase interpolator 313.

The control voltage 312 contains phase shift information corresponding to the result of the phase comparison performed by the phase frequency detector 307. The control voltage 312 corresponds to the control signal 106.

The time delay apparatus 300 further comprises a comparator 314. The comparator compares a pulse signal 315 to a reference signal 316. By comparing the pulse signal 315 with the reference signal 316, which is in one embodiment chosen constant, the comparator generates a digital signal 318 (for example square-like or rectangular-like) which corresponds to the signal denoted by F1. Illustratively, the comparator shapes up the pseudo-random pulse signal 315 to a square wave. The pulse signal 315 is in one embodiment pseudo-random.

The control voltage 312 specifies the phase shift ΔPh. Since the phase locked loop 304 is a feedback system, it ensures that there is minimal drift in the generated phase shift ΔPh.

Every programming of the phase shift (by setting the plurality of input bits) requires the phase locked loop 304 to re-acquire lock. In one embodiment the worst case lock time for the phase locked loop 304 (from power up) is 50 μsecs.

Using the phase shift information embedded into the control voltage 312, the phase interpolator generates the plurality of output signals 301. These may be buffered by a buffer 317 for off-chip driving capabilities. In one embodiment, high-speed buffers are used to obtain fast rise and fall times in addition to off-chip driving capabilities. An example of a simulated system specification is summarized below.

In one embodiment, the phase interpolator 313 is implemented by a plurality of phase interpolators, each generating one of the output signals of the plurality of output signals by phase shifting the digital signal 318.

The phase interpolator 313 is in one embodiment a modified version of the voltage controlled oscillator 310. Illustratively, the voltage controlled oscillator 310 is a closed loop. The phase interpolator 313 gives an open loop response.

In one embodiment, the time delay system 300 has the following technical characteristics.
Phase tuning
    10 MHz reference frequency (i.e. frequency of the reference clock signal 305) provided by a crystal oscillator
    phase shift ΔPh tunable from 100 psec to 500 psec
    phase resolution: 100 psec
Input (as pulse signal 315)
    single ended waveform
    amplitude: 0V to 1V
    Maximum frequency 25 MHz
Output
    N outputs with constant phase change ΔPh (as explained with reference to FIG. 2)
Output signal swing
    0V to 1V with 50 Ohm termination
    Typical specification risetime trise=60 psec, falltime tfall=36 psec, amplitude 0V to 969 mV With this characteristics, the time delay system 300 is capable of generating pulses with fast risetime and/or fast falltime for beam forming or beam steering. In particular, the plurality of signals 301 may be used for ultra wide band (UWB) beam forming or beam steering. UWB is typically defined as a minimum of 20% of the bandwidth or at least 500 MHz.

Figure 4:
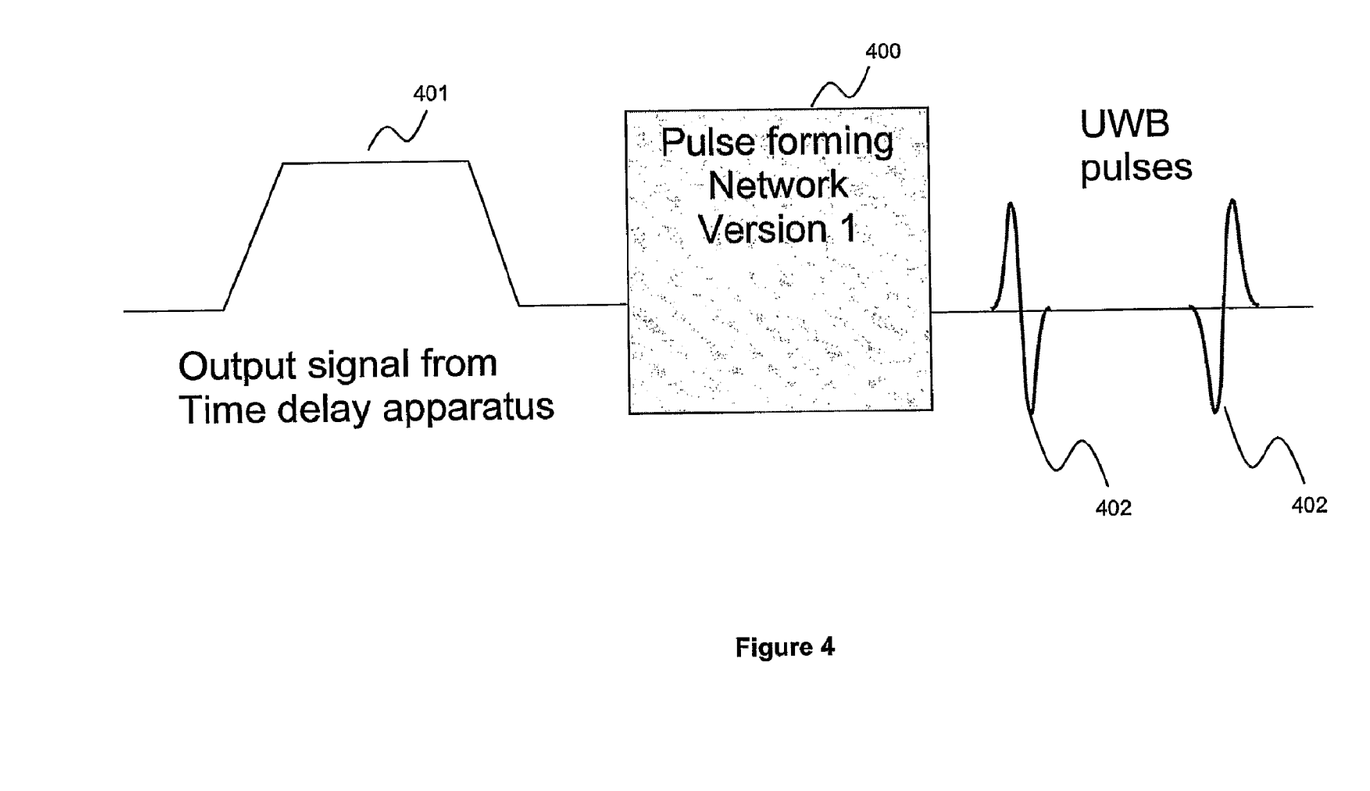
FIG. 4 shows a first pulse forming network according to an embodiment of the invention.

The application of the transmitter 100 shown in FIG. 1 to ultra wide band is illustrated by FIG. 4.

FIG. 4 shows a first pulse forming network 400 according to an embodiment of the invention.

The pulse forming network 400 corresponds to one of the pulse forming networks 109 shown in FIG. 1. One signal of the plurality of signals 301 generated by the time delay system 300 is used as input signal 401 to the first pulse forming network 400.

The risetime, which is for example 60 psec, is used by the pulse forming network, which for example performs a differentiation, to produce one or more UWB pulses.

Switches with two ports may be provided between the outputs of the pulse forming networks 109 and the antenna array 110 such that only one of the UWB pulses output from a pulse forming network 109 is selected and connected to only one of the antenna elements of the antenna array 110 to form another beamsteering sub-system. A plurality of these sub-systems may be used to steer a beam using a plurality of time delays.

In ultra wideband radar operations, it is important to control the time delay of high-speed radio pulses for correlation. An example for such an application of a variable time delay system in a receiver is shown in FIG. 5.

Figure 5:
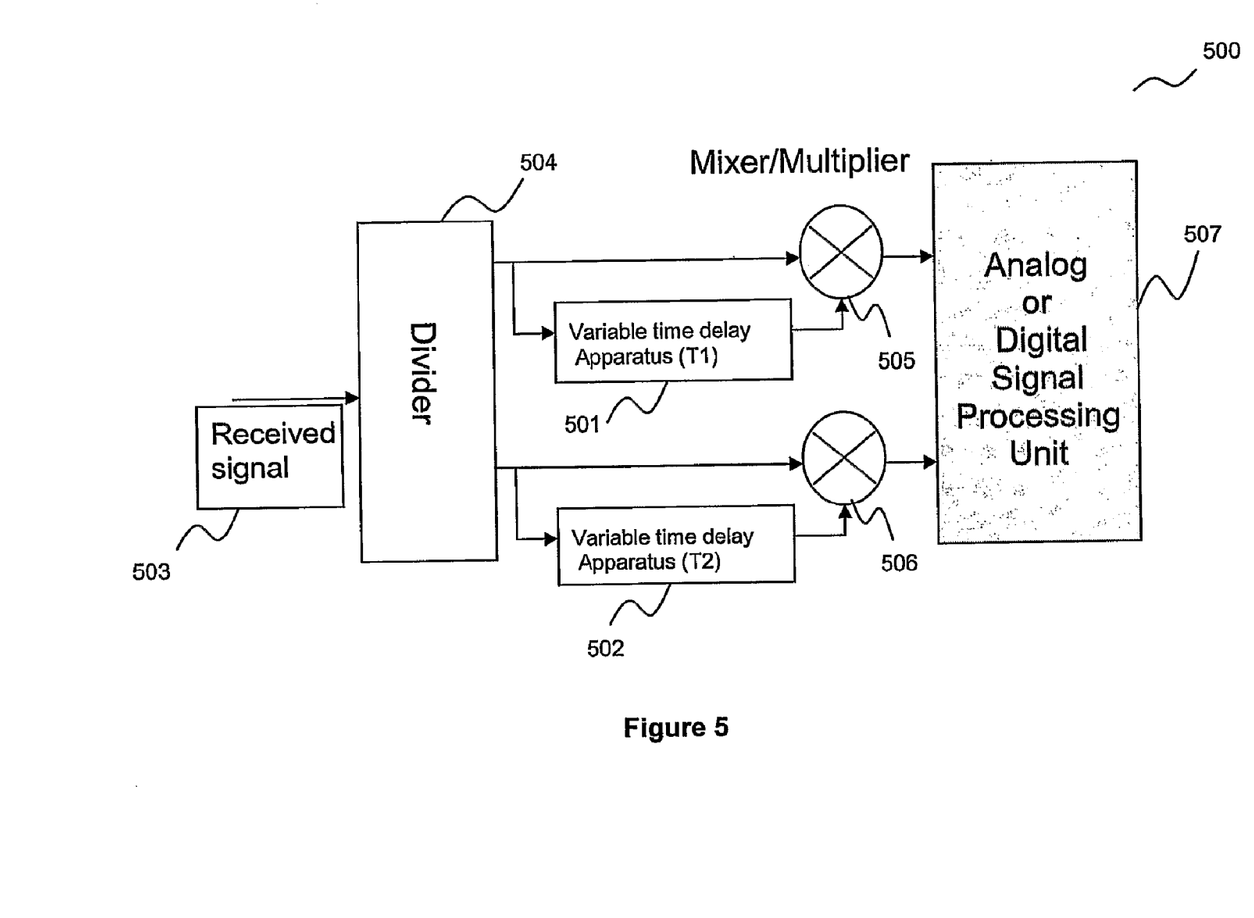
FIG. 5 shows a system processing system according to an embodiment of the invention.

FIG. 5 shows a system processing system 500 according to an embodiment of the invention.

The processing system 500 may be part of a receiver and comprises a first time delay module 501 and a second time delay module 502. The first time delay module 501 and the second time delay module 502 are different from the time delay apparatus 300 shown in FIG. 3 in that they receive a signal which is delayed, i.e. phase shifted, by a time T1 (first time delay module) and a time T2 (second time delay module), respectively.

The first time delay module 501 and the second time delay module 502 may be programmable to set the introduced phase shifts, i.e. to set the times T1 and T2, in a similar way as the time delay apparatus 300.

A received signal 503 is divided by a divider 504 and fed into the first time delay module 502, a first multiplier (or mixer) 505, the second time delay module 502 and a second multiplier (or mixer) 506.

The received signal is delayed by the time T1 by the first time delay module 501 and the delayed received signal is then correlated with the (original) received signal 503 by the first multiplier 505 to maximize the correlated output energy.

Further, the received signal is delayed by the time T2 by the second time delay module 502 and the delayed received signal is then correlated with the (original) received signal 503 by the second multiplier 506. The time T2 represents the time delay required to correlate the received signal 503 for maximum energy when the position of a moving target is tracked.

The output of the first multiplier 505 and the second multiplier 506 are fed into an analog or digital processing unit 507.

The invention is also applicable to other types of communication or radar systems shere variable time delay operations are required.

In one embodiment, an analog to digital converter (ADC) is used instead of the comparator 314 to generate input digital signals. This is illustrated in FIG. 6.

Figure 6:
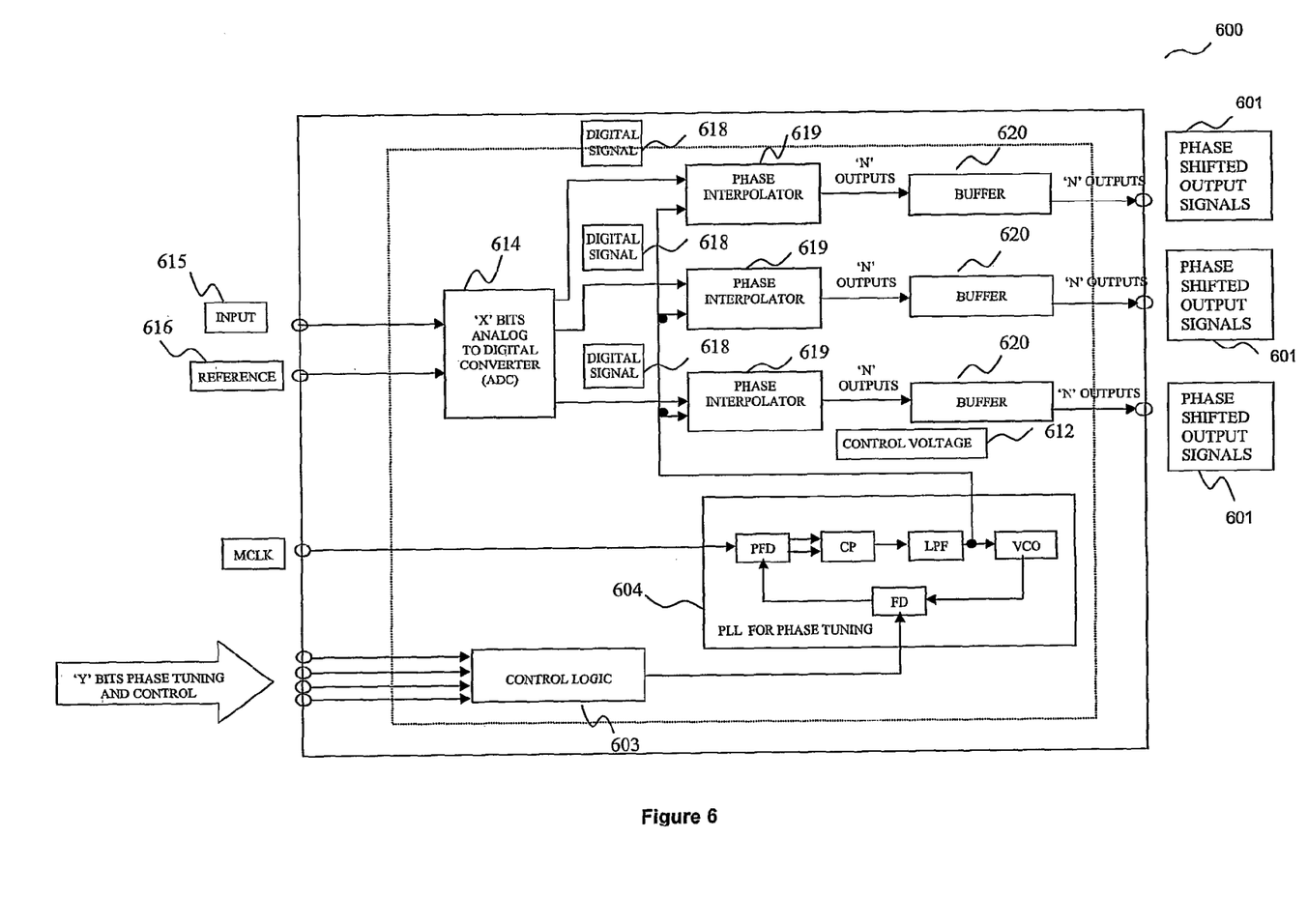
FIG. 6 shows a time delay system according to an embodiment of the invention.

FIG. 6 shows a time delay system 600 according to an embodiment of the invention.

The time delay system 600 is similar to the time delay system 300 shown in FIG. 3. The time delay system 600 comprises a phase locked loop 604 and a control logic 603 with the same functionality as the phase locked loop 304 and the control logic 303 as described above with reference to FIG. 3. In particular, the phase locked loop generates a control voltage 612.

Similar to the time delay system 300, the time delay system 600 receives a pulse signal 615 and a reference signal 616 as input. However, the pulse signal 615 and the reference signal 616 are not compared, but the pulse signal 615 is converted from analog to digital by an analog to digital converter 614. According to the conversion of the pulse signal 615, the analog to digital converter 614 generates a plurality of digital signals 618 each digital signal 618 corresponding to one bit of the output of the analog to digital converter 614.

Similar to the digital signal 318 shown in FIG. 3, each digital signal 618 is phase shifted by a phase interpolator 619 to generate a plurality of phase shifted output signals 601.

Each plurality of phase shifted output signals 601 may be buffered by a corresponding buffer 620.

The phase interpolators 619 all derive the same phase shift information from the control voltage 612.

Figure 7:
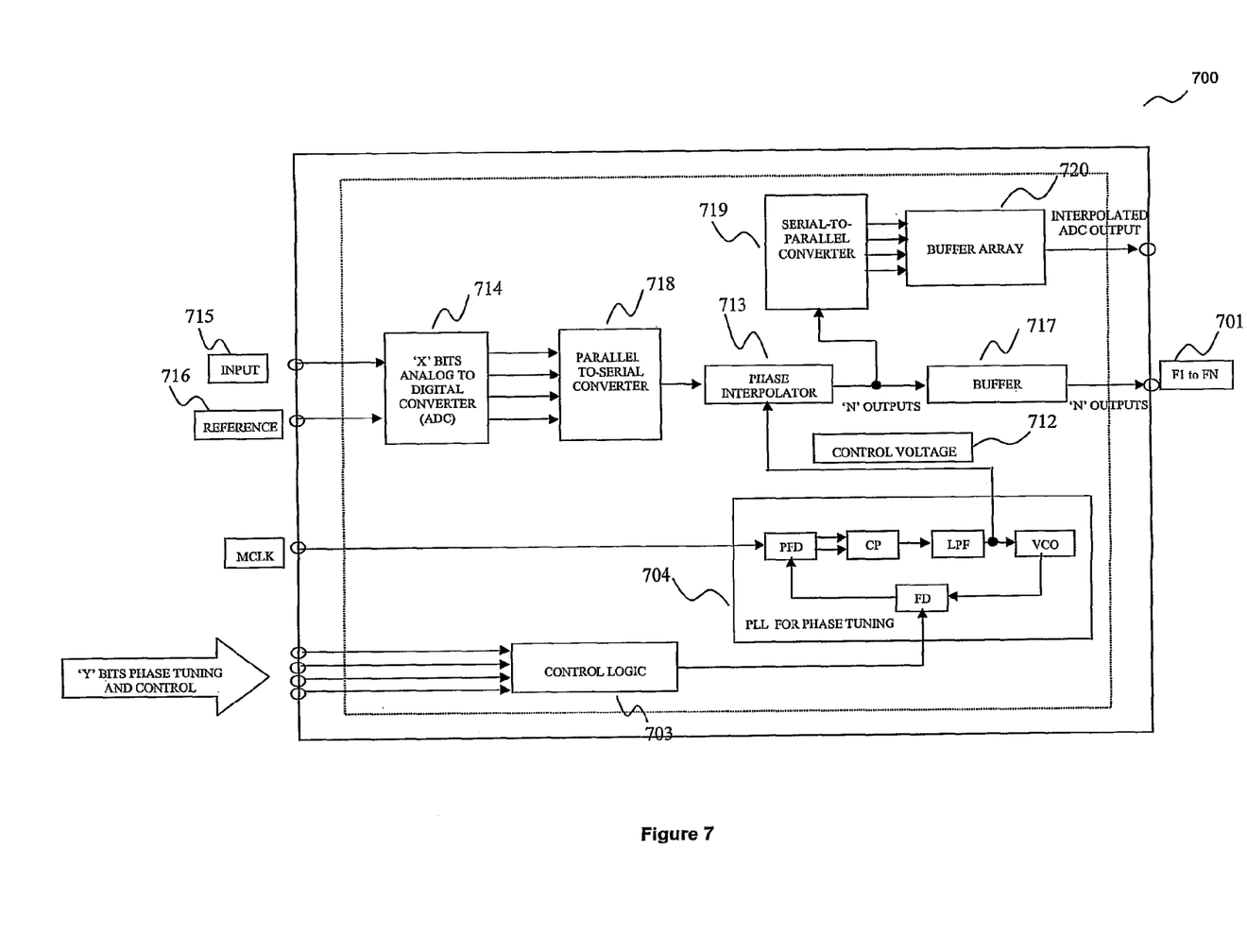
FIG. 7 shows a time delay apparatus according to an embodiment of the invention.

The time delay apparatus 300 may be modified by using a parallel-to-serial converter and/or a serial-to-parallel-converter as shown in FIG. 7.

FIG. 7 shows a time delay apparatus 700 according to an embodiment of the invention.

The time delay system 700 is similar to the time delay system 700 shown in FIG. 6. The time delay system 700 comprises a phase locked loop 704 and a control logic 703 with the same functionality as the phase locked loop 304 and the control logic 303 described above with reference to FIG. 3. In particular, the phase locked loop generates a control voltage 712.

As the time delay apparatus 600, the time delay apparatus 700 comprises an analog to digital converter 714 adapted to convert a pulse signal 715 using a reference signal 716. The output of the analog to digital converter 714 is converted by a parallel to serial converter 718 to a serial stream of bits which has the form of a digital signal. The serial stream of bits is phase shifted by a phase interpolator 713 using the control voltage 712 to generate a plurality of output signals 701 as it is done with the digital signal 318 by the phase interpolator 713 shown in FIG. 3. Similar to above, the plurality of output signals 701 may be buffered by a buffer 717.

The output of the phase interpolator 713 is also converted from serial to parallel by a serial to parallel converter 719. The output of the serial to parallel converter is a set of interpolated ADC outputs. These outputs may be bufferd using a buffer array 720 for off-chip driving capabilities.

In this document, the following publications are cited:
[1] U.S. Pat. No. 5,943,010
[2] U.S. Pat. No. 6,794,912

The invention claimed is:

1. A time delay apparatus for generating a plurality of phase shifted signals comprising:
   a phase locked loop generating a phase control signal, the phase locked loop comprising
      a voltage controlled oscillator that generates a first clock signal;
      a frequency divider for dividing the first clock signal;
      receiving means for receiving a second clock signal; and
      a phase comparator for comparing a phase difference between an output of the frequency divider and the second clock signal to produce the phase control signal;
   wherein:
      the phase control signal specifies the phase difference,
      the phase difference is programmable by setting a factor by which the frequency divider divides the first clock signal, and
      the voltage controlled oscillator receives the phase control signal for controlling a frequency of the first clock signal; and
   a phase interpolator receiving at least one digital signal and generating the plurality of phase shifted signals by phase shifting the digital signal according to the phase control signal.

2. The time delay apparatus according to claim 1, wherein the phase locked loop further comprises:
   a charge pump for converting a digital error signal produced by the phase comparator to an analog error signal; and
   a low pass filter for filtering the analog error signal to produce the phase control signal.

3. The time delay apparatus according to claim 2, wherein the digital error signal is a digital error pulse signal.

4. The time delay apparatus according to claim 2, wherein the analog error signal is an analog error current.

5. The time delay apparatus according to claim 3, wherein the analog error signal is an analog error current.

6. The time delay apparatus according to claim 1, further comprising a buffer for buffering the plurality of phase shifted signals.

7. The time delay apparatus according to claim 1 further comprising a comparator receiving at least one wave signal and generating the at least one digital signal by shaping the at least one wave signal.

8. The time delay apparatus according to claim 7, wherein the comparator is an analog to digital converter.

9. The time delay apparatus according to claim 1, wherein each phase shifted signal of the plurality of phase shifted signals is generated by the phase interpolator by phase shifting the digital signal according to multiples of the phase difference.

10. The time delay apparatus according to claim 1, wherein the digital signal is random.

11. The time delay apparatus according to claim 1, wherein the digital signal is pseudo-randomly generated.

12. A time delay apparatus for generating a plurality of phase shifted signals comprising:
   a comparator receiving at least one wave signal and generating at least one digital signal by shaping the at least one wave signal;
   a phase locked loop generating a phase control signal, the phase locked loop comprising
      a voltage controlled oscillator that generates a first clock signal;
      a frequency divider for dividing the first clock signal;
      receiving means for receiving a second clock signal; and
      a phase comparator for comparing a phase difference between an output of the frequency divider and the second clock signal to produce the phase control signal;
   wherein:
      the phase control signal specifies the phase difference,
      the phase difference is programmable by setting a factor by which the frequency divider divides the first clock signal, and
      the voltage controlled oscillator receives the phase control signal for controlling a frequency of the first clock signal; and
   a phase interpolator receiving the at least one digital signal and generating the plurality of phase shifted signals by phase shifting the digital signal according to the phase control signal.

* * * * *